(12) United States Patent
Tomita et al.

(10) Patent No.: US 8,183,158 B2
(45) Date of Patent: May 22, 2012

(54) SEMICONDUCTOR PROCESSING APPARATUS AND METHOD FOR USING SAME

(75) Inventors: Masahiko Tomita, Nirasaki (JP); Kota Umezawa, Nirasaki (JP); Ryou Son, Nirasaki (JP); Toshiharu Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1117 days.

(21) Appl. No.: 11/907,820

(22) Filed: Oct. 17, 2007

(65) Prior Publication Data

US 2008/0093023 A1 Apr. 24, 2008

(30) Foreign Application Priority Data

Oct. 19, 2006 (JP) .................. 2006-284862
May 16, 2007 (JP) .................. 2007-131056

(51) Int. Cl.
*H01L 21/311* (2006.01)

(52) U.S. Cl. ... 438/696; 438/706; 118/17; 257/E21.224; 257/E21.227

(58) Field of Classification Search .......... 438/696, 438/706; 118/17; 257/E21.224, E21.227
See application file for complete search history.

(56) References Cited

U.S. PATENT DOCUMENTS 6,825,123 B2 * 11/2004 Haerle et al. .......... 438/695
7,887,637 B2 2/2011 Ozaki et al.
2004/0109800 A1 * 6/2004 Pahlman et al. .......... 423/210

FOREIGN PATENT DOCUMENTS

| JP | 4-162713 | 6/1992 |
| JP | 5-109640 | 4/1993 |
| JP | 9-246257 | 9/1997 |
| JP | 2001-250818 | 9/2001 |
| JP | 2002-9009 | 1/2002 |
| JP | 2002-313787 | 10/2002 |
| JP | 2008-78457 | 4/2007 |
| KR | 10-2006-0061843 | 6/2006 |

OTHER PUBLICATIONS

Korean Office Action issued on Aug. 29, 2011 for Application No. 10-2007-0104986 w/ English language translation.
Japanese Office Action issued on Oct. 11, 2011 for Application No. 2009-023809 with English translation.

* cited by examiner

*Primary Examiner* — Thanh V Pham
(74) *Attorney, Agent, or Firm* — Smith, Gambrell & Russell, LLP

(57) ABSTRACT

A method for using a semiconductor processing apparatus includes supplying an oxidizing gas and a reducing gas into a process container of the processing apparatus accommodating no product target substrate therein; causing the oxidizing gas and the reducing gas to react with each other within a first atmosphere that activates the oxidizing gas and the reducing gas inside the process container, thereby generating radicals; and removing a contaminant from an inner surface of the process container by use of the radicals.

14 Claims, 10 Drawing Sheets

| CLEANING STEP | | O₂ FLOW RATE [slm] | H₂ FLOW RATE [slm] | TEMPERATURE [°C] | PRESSURE [Torr] | TIME [hr] | RATING |
|---|---|---|---|---|---|---|---|
| PE1 | O₂ + H₂ | 2 | 1 | 900 | 0.35 | 12 | ◎ |
| PE2 | O₂ + H₂ | 2 | 1 | 800 | 0.35 | 12 | ○ |
| CE1 | O₂ | 3 | 0 | 900 | 0.35 | 12 | × |
| CE2 | H₂ | 0 | 3 | 900 | 0.35 | 12 | × |

FIG.6

SEMICONDUCTOR PROCESSING APPARATUS AND METHOD FOR USING SAME

BACKGROUND OF THE INVENTION

1. Field of the Invention

The present invention relates to a semiconductor processing apparatus for performing a semiconductor process on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer (made of, e.g., silicon) is subjected to various processes, such as film formation, etching, oxidation, diffusion, reformation, annealing, and natural oxide film removal. There is a vertical film formation apparatus (of the so-called batch type), which performs a film formation process on a plurality of semiconductor wafers all together (for example, see Jpn. Pat. Appln. KOKAI Publications No. 9-246257 and No. 2002-9009). For example, a film formation process of this kind is arranged to form a thin film on semiconductor wafers, as follows.

At first, the interior of the process container of a heat processing apparatus is heated by a heater at a predetermined load temperature, and a wafer boat that holds a plurality of semiconductor wafers is loaded. Then, the interior of the process container is heated up to a predetermined process temperature, and gas inside the process container is exhausted through an exhaust port, so that the pressure inside the process container is decreased to a predetermined pressure.

Then, while the interior of the process container is kept at the predetermined temperature and pressure (kept exhausted), a film formation gas is supplied through a process gas feed line into the process container. For example, in the case of CVD, when a film formation gas is supplied into a process container, the film formation gas causes a thermal reaction and thereby produces reaction products. The reaction products are deposited on the surface of each semiconductor wafer, and form a thin film on the surface of the semiconductor wafer.

Quartz component members, such as the process container, thermally insulating cylinder, and wafer boat, are made from high quality quartz material with high purity and few impurities to prevent wafers from suffering metal contamination. However, a trace amount of metal is inevitably contained in the quartz material from the beginning, or a trace amount of metal is inevitably mixed, e.g., as an oxide in the quartz material during a process step, such as welding, of manufacturing thereof.

Accordingly, for example, when semiconductor wafers are processed within a reduction atmosphere, a metal oxide contained in quartz material as described above is subjected to a deoxidizing reaction. Consequently, a metal is precipitated on the surface of the quartz material, and may bring about metal contamination on the wafers. Particularly, as metal contamination, copper contamination due to copper oxide is prominent.

Conventionally, as a method for preventing such metal contamination, the following methods are known. Jpn. Pat. Appln. KOKAI Publication No. 5-109640 discloses a cleaning process in which hydrogen gas, which has a gettering function for removing metal contaminants, is supplied into a process container to remove metal contaminants. Jpn. Pat. Appln. KOKAI Publication No. 2002-313787 discloses a cleaning process in which a halogen compound, such as HCl gas, is supplied into a process container to transform metals into chlorides having high vapor pressures, so as to remove metal contaminants by sublimation.

A cleaning process of this kind is performed when a new member made of quartz material, such as a wafer boat or thermally insulating cylinder, is installed, because metal contaminants may be present on the surface of this member. Further, a cleaning process of this kind is regularly or irregularly performed when a film formation process is repeated a predetermined number of times, because metal contaminants contained in quartz material may be diffused toward the surface every time the heat process is performed.

BRIEF SUMMARY OF THE INVENTION

An object of the present invention is to provide a semiconductor processing apparatus and a method for using the same, which can reliably remove a contaminant from the inner surface of the process container, without entailing a large increase in facility cost.

According to a first aspect of the present invention, there is provided a method for using a semiconductor processing apparatus, the method comprising: supplying an oxidizing gas and a reducing gas into a process container of the processing apparatus accommodating no product target substrate therein; causing the oxidizing gas and the reducing gas to react with each other within a first atmosphere that activates the oxidizing gas and the reducing gas inside the process container, thereby generating radicals; and removing a contaminant from an inner surface of the process container by use of the radicals.

According to a second aspect of the present invention, there is provided a semiconductor processing apparatus comprising: a process container configured to accommodate a target substrate; a heater configured to heat an interior of the process container; an exhaust system configured to exhaust gas from the process container; a main process gas supply circuit configured to supply, into the process container, a main process gas for performing a semiconductor process on the target substrate; an oxidizing gas supply circuit and a reducing gas supply circuit configured to supply, into the process container, an oxidizing gas and a reducing gas, respectively, for removing a contaminant from an inner surface of the process container; a control section configured to control an operation of the apparatus, wherein the control section is preset to execute supplying the oxidizing gas and the reducing gas into the process container accommodating no product target substrate therein; causing the oxidizing gas and the reducing gas to react with each other within a first atmosphere that activates the oxidizing gas and the reducing gas inside the process container, thereby generating radicals; and removing a contaminant from the inner surface of the process container by use of the radicals.

In the second aspect, parts of the oxidizing gas supply circuit and the reducing gas supply circuit may be combined as a gas supply unit detachably connected to the process container, wherein the gas supply unit comprises an oxidizing gas cylinder that stores the oxidizing gas, a reducing gas cylinder that stores the reducing gas, a casing that encloses the oxidizing gas cylinder and the reducing gas cylinder, an oxidizing gas line connected to the oxidizing gas cylinder, provided with a flow rate controller, and having a distal end extending out of the casing, a joint disposed at the distal end of the oxidizing gas line and configured to be connected to a corresponding gas line communicating with the process container, a reducing gas line connected to the reducing gas cylinder, provided with a flow rate controller, and having a distal end extending out of the casing, a joint disposed at the distal end of the reducing gas line and configured to be connected to a corresponding gas line communicating with the process container, first and second switching valves disposed on the oxidizing gas line and the reducing gas line, respectively, and a valve control section configured to control operations of the first and second switching valves.

According to a third aspect of the present invention, there is provided a computer readable medium containing program instructions for execution on a processor, wherein the program instructions, when executed by the processor, control a semiconductor processing apparatus to execute supplying an oxidizing gas and a reducing gas into a process container of the processing apparatus accommodating no product target substrate therein; causing the oxidizing gas and the reducing gas to react with each other within a first atmosphere that activates the oxidizing gas and the reducing gas inside the process container, thereby generating radicals; and removing a contaminant from an inner surface of the process container by use of the radicals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a diagram showing the content of cleaning processes performed in the experiment and the results of synthetic rating thereof;

DETAILED DESCRIPTION OF THE INVENTION

Figure 1:
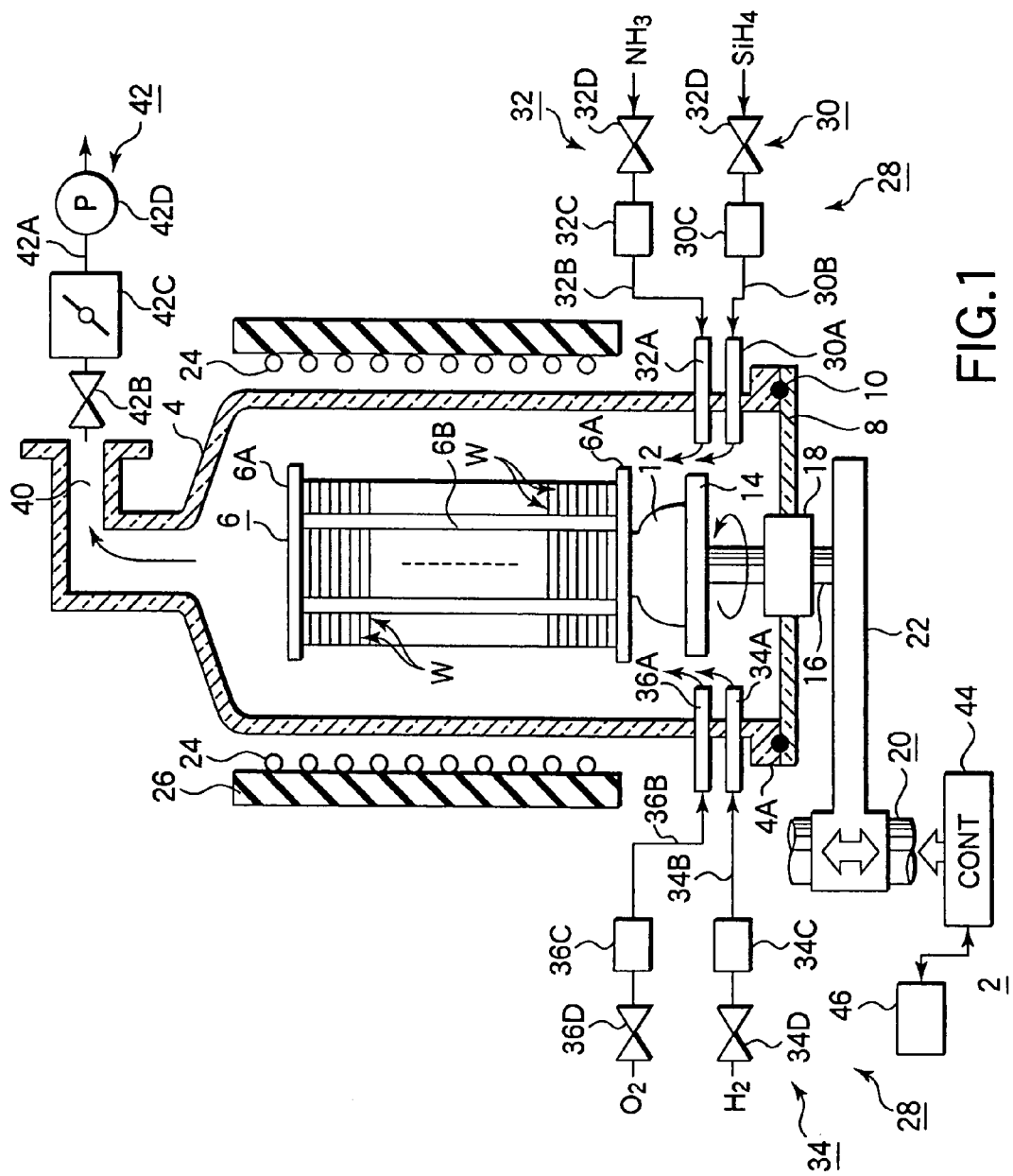
FIG. 1 is a view showing a vertical semiconductor processing apparatus (film formation apparatus) according to an embodiment of the present invention.

In the process of developing the present invention, the inventors studied techniques for removing metal contaminants in semiconductor processing apparatuses. As a result, the inventors have arrived at the findings given below.

In the case of the cleaning process using a gettering function of hydrogen gas to remove metal contaminants, the metal contaminants can be removed to some extent, but not sufficiently. On the other hand, in the case of the cleaning process using a halogen compound, such as HCl gas, to remove metal contaminants, component members of the processing apparatus, made of, e.g., stainless steel, may be corroded. Further, except for special apparatuses, processing apparatuses do not include a supply line of a halogen gas, such as HCl, in general. Accordingly, a new halogen gas supply line needs to be established, and the facility cost is increased by that much. The problem described above similarly arises in processing apparatuses of the single-substrate type, in which a wafer supporting susceptor and/or a process container are made of quartz or silicon carbide.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical semiconductor processing apparatus (film formation apparatus) according to an embodiment of the present invention. The processing apparatus 2 includes a vertical process container 4 having a cylindrical shape with an opened bottom and a predetermined length in the vertical direction. The process container 4 is made of a heat-resistant and corrosion-resistant material, such as quartz (or silicon carbide (SiC)).

A wafer boat 6 made of quartz (or silicon carbide) is moved up and down through the bottom port of the process container 4, so that the wafer boat 6 is loaded and unloaded to and from the process container 4. The wafer boat 6 can support a plurality of semiconductor wafers W at predetermined intervals in the vertical direction. Specifically, the wafer boat 6 includes two quartz support plates 6A at the top and bottom and a plurality of quartz support rods 6B connecting the support plates 6A. For example, in this embodiment, the support rods 6B of the wafer boat 6 can support 50 to 100 wafers W having a diameter of 300 mm at essentially regular intervals in the vertical direction. The size of wafers W and the number of wafers W to be supported are not limited to this example.

The bottom port of the process container 4 can be airtightly closed by a lid 8 made of, e.g., quartz (or silicon carbide). A seal member 10, such as an O-ring, is interposed between the periphery of the lid 18 and the bottom of the process container 4, so that the interior of the process container 4 can be kept airtight. The lid 8 may be made of a stainless steel plate.

The wafer boat 6 is placed on a table 14 through a thermally insulating cylinder 12 made of quartz. The table 14 is supported on the top of a rotary shaft 16, which penetrates the lid 8 for opening/closing the bottom port of the process container 4. The portion of the lid 8 where the rotary shaft 16 penetrates is provided with, e.g., a magnetic-fluid seal 18, so that the rotary shaft 16 is rotatably supported in an airtightly sealed state.

The rotary shaft 16 is attached at the distal end of an arm 22 supported by an elevating mechanism 20, such as a boat elevator. The elevating mechanism 20 moves the wafer boat 6 and lid 8 up and down integratedly. The table 14 may be fixed to the lid 8, so that wafers W are processed without rotation of the wafer boat 6.

The process container 4 is surrounded by a thermally insulating casing 26 for ensuring thermal stability. The casing 26 is provided with a heater 24 on the inner surface for heating the atmosphere and wafers W inside the process container 4. For example, the heater 24 is formed of a carbon wire, which causes no contamination and has good characteristics for increasing and decreasing the temperature.

A gas supply mechanism 28 is connected to the sidewall of the process container 4 near the bottom to supply predetermined gases into the process container 4. Specifically, the gas supply mechanism 28 includes a source gas supply circuit 30 for supplying a film formation source gas, a first reducing gas supply circuit 32 for supplying a first reducing gas, such as $NH_3$ gas, a second reducing gas supply circuit 34 for supplying a second reducing gas, such as $H_2$ gas, and an oxidizing gas supply circuit 36 for supplying a an oxidizing gas, such as $O_2$ gas.

Further, the gas supply mechanism 28 includes an inactive gas supply circuit (not shown) for supplying an inactive gas, such as $N_2$ gas or a rare gas, e.g., Ar or He, as a purge gas or a dilution gas, as needed. The source gas supply circuit 30, first reducing gas supply circuit 32, second reducing gas supply circuit 34, and oxidizing gas supply circuit 36 include first to fourth gas nozzles 30A, 32A, 34A, and 36A, respectively, each of which is made of quartz (or silicon carbide) and penetrates the sidewall of the process container 4 near the bottom. In practice, the gas nozzles 30A to 36A are inserted in a thick flange 4A formed at the bottom of the process container 4. In place of the structure described above, the lower side of the process container 4 may be formed of a cylindrical manifold made of stainless steel, to which the gas nozzles 30A to 36A are connected.

The first to fourth gas nozzles 30A, 32A, 34A, and 36A are respectively connected to gas lines 30B, 32B, 34B, and 36B. The gas supply lines 30B, 32B, 34B, and 36B are provided with flow rate controllers 30C, 32C, 34C, and 36C, such as mass flow controllers, and switching valves 30D, 32D, 34D, and 36D, respectively. With this arrangement, the gases described above can be supplied at controlled flow rates, as needed.

An exhaust port 40 having an L-shape bent in a horizontal direction is formed at the top of the process container 4. The exhaust port 40 is connected to a vacuum-exhaust system 42 for vacuum-exhausting the interior of the process container 4. Specifically, the vacuum-exhaust system 42 has an exhaust line 42A provided with a switching valve 42B, a pressure control valve 42C, such as a butterfly valve, and a vacuum pump 42D in this order. The apparatus further includes an apparatus control section 44 formed of, e.g., a computer, to control the entire operation of the apparatus. The apparatus control section 44 includes a storage portion 46 comprising, e.g., a flexible disk, a flash memory, a hard disk, a CD-ROM, and/or a DVD, for storing computer readable programs for controlling the entire operation of the apparatus.

Next, an explanation will be given of a film formation process and a cleaning process performed in the processing apparatus 2 having the structure described above. The operations described below are performed in accordance with programs stored in the storage portion 46, as described above.

When the processing apparatus 2 is set in standby with no semiconductor wafers W loaded therein, the process container 4 is maintained at a temperature lower than the process temperature. When the process is started, at first, a number of new semiconductor wafers W are inserted into the wafer boat 6 at predetermined intervals in the vertical direction. Then, the wafer boat 6 is moved up by the boat elevator 20 and loaded into the process container 4 from below. Further, the bottom port of the process container 4 is closed by the lid 8 to airtightly seal the process container 4.

Then, the voltage applied to the heater 24 is increased to heat the wafers W to a predetermined process temperature, and the interior of the process container 4 is vacuum-exhausted by the exhaust system 42. Further, predetermined film formation gases are supplied from nozzles of the gas supply mechanism 28 at controlled flow rates into the process container 4. For example, a source gas, such as monosilane ($SiH_4$) gas, is supplied from the gas nozzle 30A of the source gas supply circuit 30, and $O_2$ gas is supplied from the gas nozzle 36A of the oxidizing gas supply circuit 36. The film formation gases cause a thermal decomposition reaction while they flow upward inside the process container 8, so that an $SiO_2$ film is formed on the surface of the wafers W by deposition.

While this film formation process is repeated a plurality of times, metal oxides contained in component members made of quartz (or silicon carbide), such as the process container 4, wafer boat 6, thermally insulating cylinder 12, lid 10, and gas nozzles 30A, 32A, 34A, and 36A, are gradually precipitated on the material surface due to thermal diffusion or the like. Accordingly, a cleaning process for removing metal oxides, such as copper oxide, is regularly or irregularly performed. Further, when a component member made of quartz (or silicon carbide) is replaced with a new one, a cleaning process for removing metal oxides present on or in its surface is preferably performed. Although, the process described above is exemplified by a process for forming an $SiO_2$ film, a cleaning process of this kind is preferably performed particularly after a process is performed on wafers by use of a reduction atmosphere. This is so, because metal oxides, which cause metal contamination, may be subjected to a deoxidizing reaction by the reduction atmosphere and transformed into metal atoms, which are precipitated on the material surface from inside.

Figure 2:
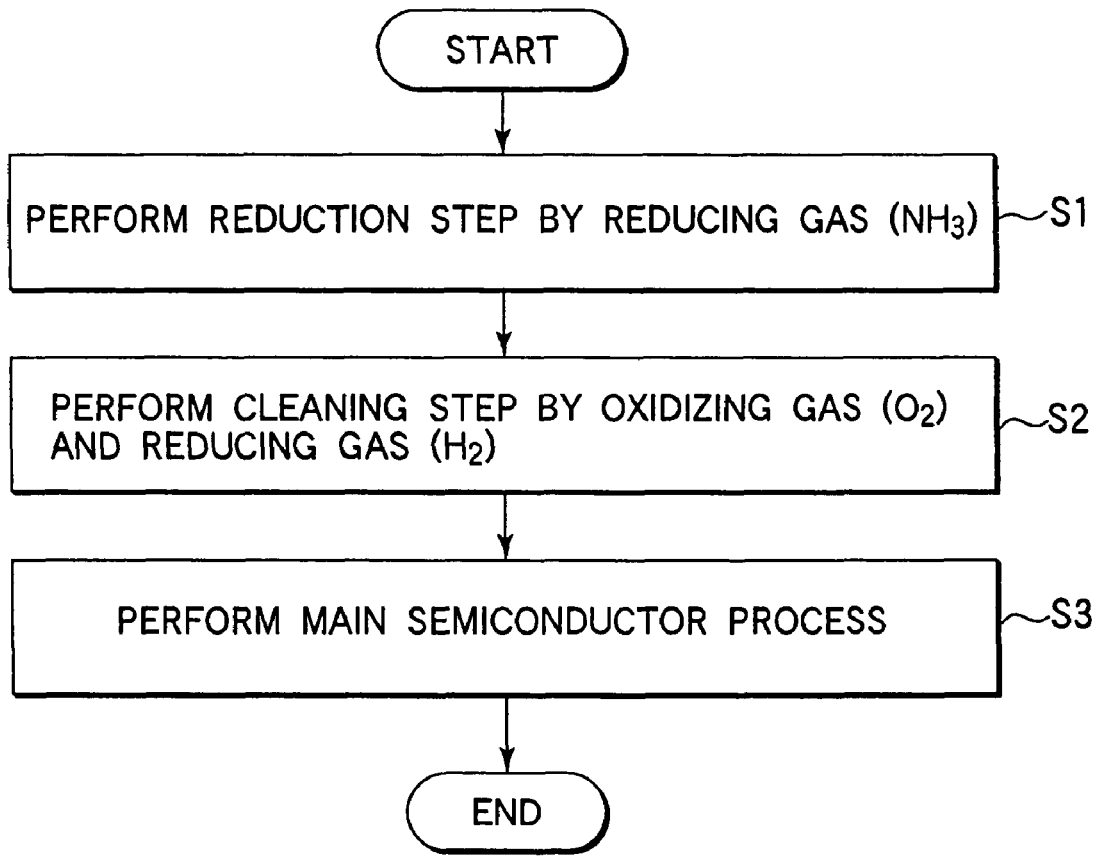
FIG. 2 is a flow chart showing an example of a process flow including a cleaning method according to an embodiment of the present invention, as a step.

FIG. 2 is a flow chart showing an example of a process flow including a cleaning method according to an embodiment of the present invention, as a step.

In this cleaning process, the wafer boat 6 with no product wafers W supported thereon (in an empty state) is moved up by the boat elevator 20 and loaded into the process container 4 from below. Further, the bottom port of the process container 4 is closed by the lid 8 to airtightly seal the process container 4.

Then, the voltage applied to the heater 24 is increased to heat the wafers W to a predetermined process temperature, and the interior of the process container 4 is vacuum-exhausted by the exhaust system 42. Further, $NH_3$ gas used as a reducing gas is supplied from the first reducing gas supply circuit 32 at a controlled flow rate into the process container 4. By doing so, a reduction step is performed inside the process container 4 by use of an atmosphere that activates the reducing gas (Step S1), to deoxidize metal oxides present at the surface of component members, such as the wafer boat 6 and process container 4. This step is conceived to facilitate removal of metals in the following cleaning step.

The process temperature and process pressure used in the reduction step of Step S1 are not limited to specific values, as long as they allow metal oxides to be deoxidized. For example, the process temperature is set to be 400° C. or more, and preferably to be 700 to 1,000° C. The process pressure is set to be 760 Torr (101 kPa) or less, and preferably to be 0.133 to 15,999 Pa. In this embodiment, the reducing gas used in the reduction step of Step S1 differs from the reducing gas used in the following cleaning step. However, the reducing gas used in this reduction step can be the same as or different from the reducing gas used in the cleaning step. Since the reduction step is performed to facilitate metal precipitation, this step may be omitted, as the case may be.

After the reduction step (Step S1) described above is finished, the cleaning step is performed (Step S2). In this cleaning step, $O_2$ gas used as an oxidizing gas is supplied from the oxidizing gas supply circuit 36 at a predetermined flow rate, and $H_2$ gas used as a reducing gas is supplied from the second reducing gas supply circuit 34 at a predetermined flow rate, both into the process container 4. By doing so, these gases are caused to react with each other (a combustion reaction) inside the process container 4 by use of an atmosphere that activates these gases, to generate oxygen radicals, hydroxyl group radicals, and hydrogen radicals. Then, cleaning is performed on component members inside the process container 4 by use of a radical atmosphere containing these radicals.

At this time, while the $O_2$ gas and $H_2$ gas flow upward from the bottom to the top inside the process container 4, they react with each other within a vacuum atmosphere to generate oxygen radicals, hydroxyl group radicals, and hydrogen radicals. The radical atmosphere thus formed comes into contact with the surface of respective component members, such as the gas nozzles 30A to 36A, lid 8, thermally insulating cylinder 12, process container 4, and wafer boat 6, thereby removing metals, such as copper, present on the component members. The used gas is exhausted by the vacuum-exhaust system 42 through the exhaust port 40 at the top of the process container 4. The gas flow rates used in this process depend on the size of the process container 4. For example, the process container 4 has a size to accommodate 100 wafers having a diameter of 300 mm, the flow rate of $O_2$ gas is set to be 10 to 30,000 sccm, and the flow rate of $H_2$ gas is set to be 1 to 5,000 sccm.

Specifically, the $O_2$ gas and $H_2$ gas are individually supplied into the process container 4 in a hot wall state, and flow upward inside the process container 4 while they cause a hydrogen combustion reaction. With this combustion reaction, an atmosphere mainly comprising oxygen radicals ($O^*$), hydroxyl group radicals ($OH^*$), and hydrogen radicals ($H^*$) is formed and acts to remove metals from the surface of component members. The mechanism of removing metals in this process has not yet been clarified. However, it is thought that metal oxides at the surface of component members are deoxidized into metal elements, which are removed as metal fume as they are or removed as stable oxides formed in the gas atmosphere.

The process temperature used in this step is set to be 400° C. or more, such as about 900° C. If the process temperature is lower than 400° C., the activated species (radicals) described above cannot be sufficiently generated. If the process temperature is higher than 1,100° C., it exceeds the heat-resistant temperature of the process container 4 and/or wafer boat 6, and jeopardizes the safety of the process. In light of the quantity of radicals, the process temperature is preferably set to be 600° C. or more.

The process pressure used in this step is set to be 933 Pa (7.0 Torr) or less, such as 46.6 Pa (0.35 Torr). If the process pressure is higher than 7.0 Torr, the radicals described above cannot be sufficiently generated. The process pressure is preferably set to be 3.5 Torr or less, and more preferably to be 1 Torr or less. The lower limit of this pressure is 0.001 Torr (0.133 Pa).

The ratio of the flow rate of $H_2$ gas is preferably set to be 50% or more of the total flow rate of the $H_2$ gas and $O_2$ gas. According to an experiment, it has been confirmed that, where $H_2$ gas and $O_2$ gas are used for the cleaning step, the effect of removing Cu is improved by a condition richer in hydrogen. However, as described later, this effect is deteriorated where the ratio of the $H_2$ gas is set at 100%.

After the cleaning step (Step S2) described above is finished, the wafer boat 6 is unloaded. Then, wafers W are inserted onto the wafer boat 6, and the main semiconductor process, i.e., the film formation process, is performed again (Step S3).

According to the cleaning process described above, metal contaminants, particularly copper, present on and in the surface of component members are removed. Since metal contamination on semiconductor wafers W is suppressed, the throughput of products is improved by that much. In general, a lot of processing apparatuses include facilities corresponding to the second reducing gas supply circuit 34 for supplying $H_2$ gas and the oxidizing gas supply circuit 36 for supplying $O_2$ gas, as existing facilities. In this case, there is no need to establish new gas supply circuits for the cleaning gases, thereby necessitating no additional facility cost.

<Experiment>

Figure 3:
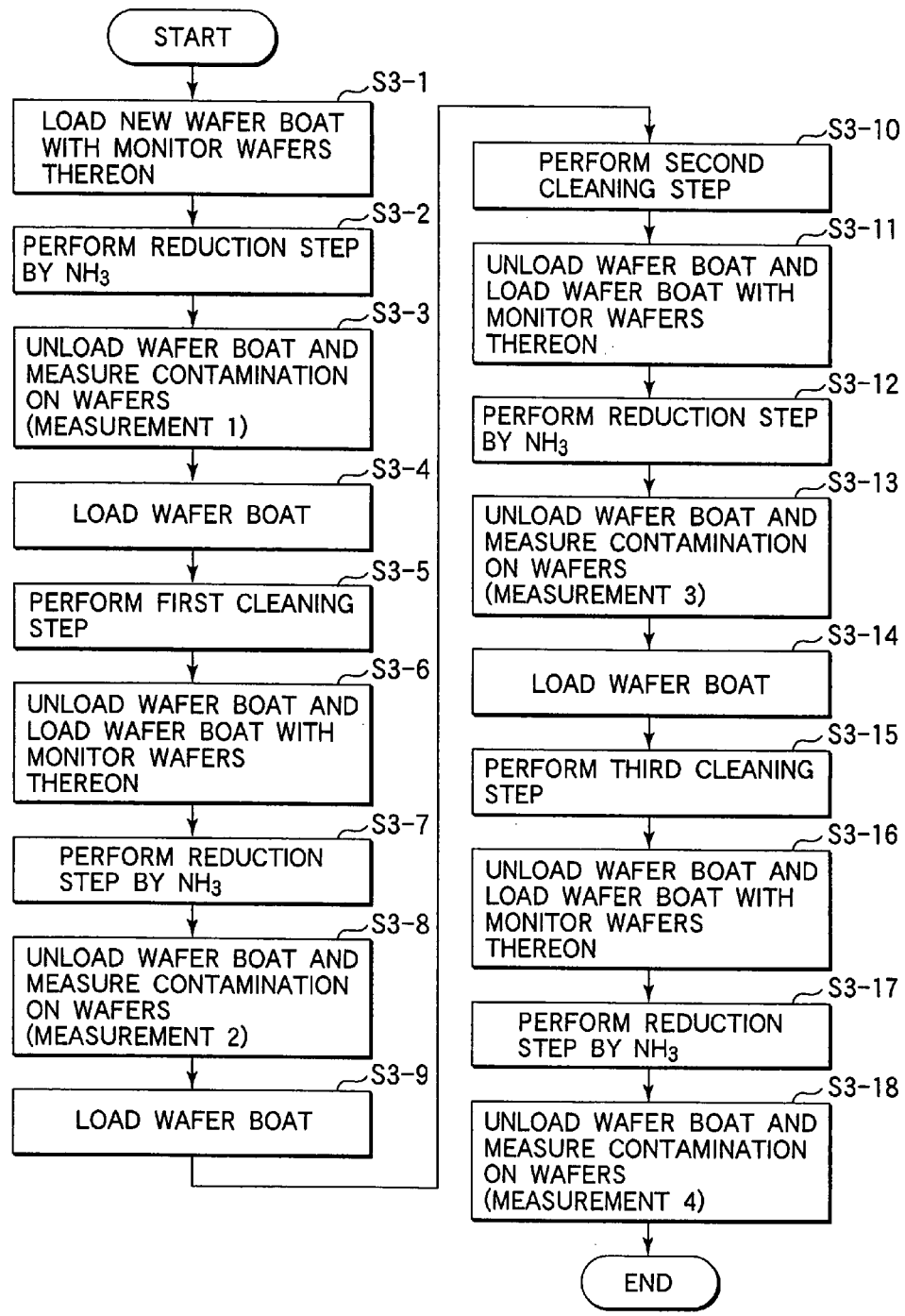
FIG. 3 is a flow chart showing a flow of steps used in an experiment of a cleaning process.

An experiment of a cleaning process was conducted to compare methods according to present examples of the embodiment described above with methods according to comparative examples. FIG. 3 is a flow chart showing a flow of steps used in the experiment of a cleaning process. As shown in FIG. 3, for each of the present examples and comparative examples, a new wafer boat 6 was prepared, and monitor wafers for measuring metal contamination were supported on the wafer boat 6. The metal contamination was measured before the cleaning step and immediately after each of three cleaning steps sequentially performed.

At first, as shown in Step S3-1, three monitor wafers W were supported on a new quartz wafer boat 6 separately in the vertical direction, and loaded into the process container 4. Then, as shown in Step S3-2, $NH_3$ gas used as a reducing gas was supplied into the process container 4 to perform a reduction step of deoxidizing metal oxides present at the surface of component members. At this time, the process temperature and process pressure were set to be the same as those of the cleaning step described below. The process time of the reduction step was set at about one hour.

Then, as shown in Step S3-3, the wafer boat 6 was unloaded from the process container 4. Then, the metal contamination on the monitor wafers was measured (Measurement 1). At this time, since the cleaning step was not yet performed, the measurement value obtained by Measurement 1 was used as a reference for rating.

Then, as shown in Step S3-4, the wafer boat 6 was set in an empty state and loaded into the process container 4. Then, as shown in Step S3-5, a predetermined gas shown in FIG. 6 was supplied to perform a first cleaning step. In this step, the present examples and comparative examples were arranged to supply the same or different gases. For example, in the present examples PE1 and PE2, "$O_2+H_2$" gas ($O_2$ gas and $H_2$ gas are supplied at the same time) was supplied. In the comparative example CE1, $O_2$ gas was supplied. In the comparative example CE2, $H_2$ gas was supplied. As regards the flow rates of the process gases, in the present examples PE1 and PE2, $O_2$ gas was set at 2 slm and $H_2$ gas at 1 slm. In the comparative example CE1, $O_2$ gas was set at 3 slm and $H_2$ gas at zero. In the comparative example CE2, $O_2$ gas was set at zero and $H_2$ gas at 3 slm. As regards the process temperature, the present example PE1 and comparative examples CE1 and CE2 used 900° C. and the present example PE2 used 800° C. As regards the process pressure, the present examples PE1 and PE2 and comparative examples CE1 and CE2 used 0.35 Torr. As regards the process time, the present examples PE1 and PE2 and comparative examples CE1 and CE2 used 12 hours.

After the first cleaning step described above was finished, as shown in Step S3-6, the wafer boat 6 was unloaded. Then, three new monitor wafers W were supported on the wafer boat 6 separately in the vertical direction, and loaded into the process container 4, as in Step S3-1. Then, as shown in Step S3-7, a reduction step was performed by use of $NH_3$ gas, as in Step S3-2.

Then, as shown in Step S3-8, the wafer boat 6 was unloaded from the process container 4, as in Step S3-3. Then, the metal contamination on the monitor wafers was measured (Measurement 2).

Then, as shown in Step S3-9, the wafer boat 6 was set in an empty state and loaded into the process container 4, as in Step S3-4. Then, as shown in Step S3-10, a predetermined gas shown in FIG. 6 was supplied to perform a second cleaning step, as in Step S3-5.

After the second cleaning step described above was finished, as shown in Step S3-11, the wafer boat 6 was unloaded, as in Step S3-6. Then, three new monitor wafers W were supported on the wafer boat 6 separately in the vertical direction, and loaded into the process container 4, as in Step S3-6. Then, as shown in Step S3-12, a reduction step was performed by use of $NH_3$ gas, as in Step S3-2.

Then, as shown in Step S3-13, the wafer boat 6 was unloaded from the process container 4, as in Step S3-3. Then, the metal contamination on the monitor wafers was measured (Measurement 3).

Then, as shown in Step S3-14, the wafer boat 6 was set in an empty state and loaded into the process container 4, as in Step S3-4. Then, as shown in Step S3-15, a predetermined gas shown in FIG. 6 was supplied to perform a third cleaning step.

After the third cleaning step described above was finished, as shown in Step S3-16, the wafer boat 6 was unloaded, as in Step S3-6. Then, three new monitor wafers W were supported on the wafer boat 6 separately in the vertical direction, and loaded into the process container 4, as in Step S3-6. Then, as shown in Step S3-17, a reduction step was performed by use of $NH_3$ gas, as in Step S3-2.

Then, as shown in Step S3-18, the wafer boat 6 was unloaded from the process container 4, as in Step S3-3. Then, the metal contamination on the monitor wafers was measured (Measurement 4).

As described above, for each of the present examples PE1 and PE2 and comparative examples CE1 and CE2, measurement was performed four times, as Measurements 1 to 4. This measurement was performed by use of an ICP (Inductive Coupled Plasma) measuring method. The measurement lower limits of metal elements were 0.027 for Cu, 0.033 for Cr, 0.029 for Ni, and 0.031 for Fe by [$\times 10^{10}$ atoms/cm$^2$].

FIGS. 4A to 4D are graphs showing a change in the number of cu (copper) atoms, obtained by the methods according to the present examples and the methods according to the comparative examples. The unit of the values is [$\times 10^{10}$ atoms/cm$^2$].

Figure 4A:
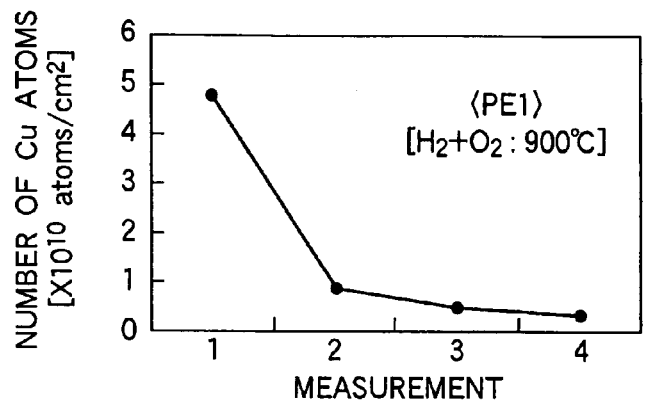
FIGS. 4A to 4D are graphs showing a change in the number of cu (copper) atoms, obtained by methods according to present examples and methods according to comparative examples.
Figure 4B:
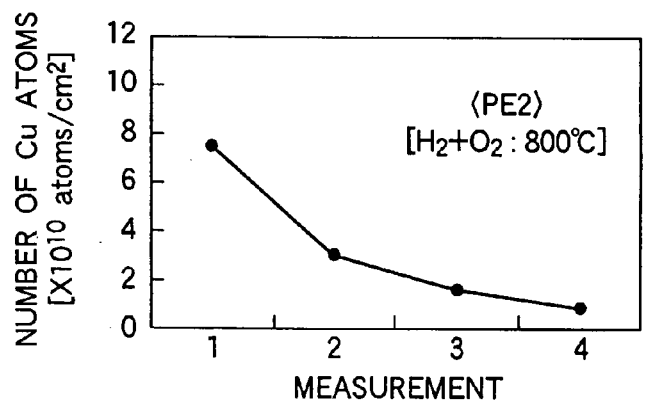

As shown in FIG. 4A corresponding to the present example PE1 and FIG. 4B corresponding to the present example PE2, in the case of the methods according to the present examples, the number of cu atoms was high, such as $5 \times 10^{10}$ atoms/cm$^2$ and $8 \times 10^{10}$ atoms/cm$^2$, respectively, at Measurement 1 before the cleaning steps. Then, the number of cu atoms was drastically decreased to be $1 \times 10^{10}$ atoms/cm$^2$ or less and $3 \times 10^{10}$ atoms/cm$^2$ or less, respectively, at Measurements 2 to 4 after the respective cleaning steps using "$H_2+O_2$" gas. Accordingly, it has been confirmed that Cu metal contamination is drastically and reliably decreased by the cleaning step.

Figure 4C:
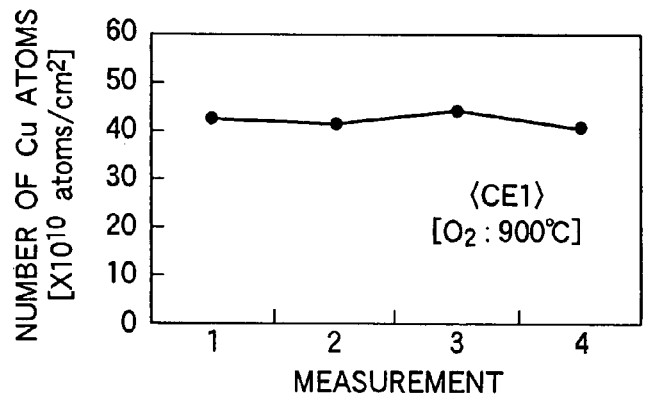

Particularly, as compared with the present example PE2 using a process temperature of 800° C., the present example PE1 using a process temperature of 900° C. higher by 100° C. rendered a larger decrease in the number of cu atoms. Accordingly, it has been confirmed that a higher temperature of the cleaning step can provide a larger decrease in the copper contamination On the other hand, as shown in FIG. 4C corresponding to the method according to the comparative example CE1, as compared to the result obtained at Measurement 1 before the cleaning step, the number of cu atoms took on almost the same high values, such as about $40 \times 10^{10}$ atoms/cm$^2$ at Measurements 2 to 4 after the respective cleaning steps using only $O_2$ gas as a cleaning step ($H_2$ gas was set at zero). Accordingly, it has been confirmed that the method according to the comparative example CE1 can hardly remove copper metal contamination.

Figure 4D:
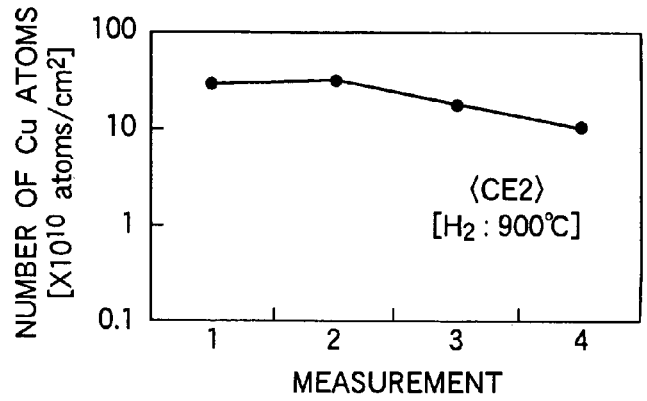

Similarly, as shown in FIG. 4D corresponding to the method according to the comparative example CE2, as compared to the result obtained at Measurement 1 before the cleaning step, the number of cu atoms was almost the same or slightly decreased within a range of about 20 to $50 \times 10^{10}$ atoms/cm$^2$ at Measurements 2 to 4 after the respective cleaning steps using only $H_2$ gas as a cleaning step ($O_2$ gas was set at zero). Accordingly, it has been confirmed that the method according to the comparative example CE2 can hardly remove copper metal contamination.

As described above, where the cleaning step was performed by use only of $O_2$ gas or $H_2$ gas (as in the methods according to the comparative examples CE1 and CE2), the effect of decreasing the copper metal contamination was not observed. On the other hand, where the cleaning step was performed by use of "$H_2+O_2$" gas, this effect was sufficiently observed.

Figure 5A:
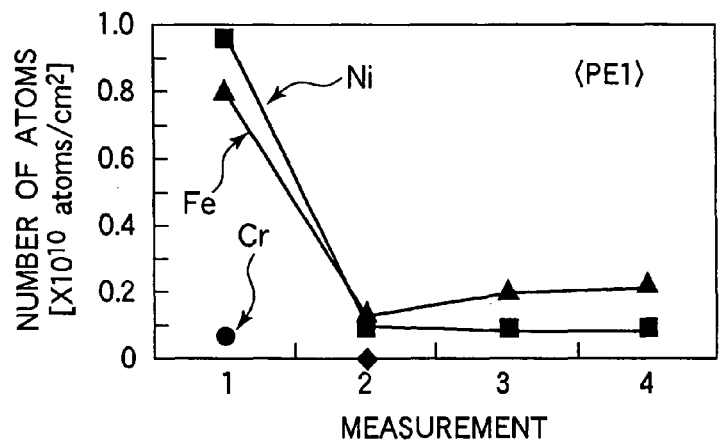
FIGS. 5A to 5C are graphs showing a change in the number of atoms of metals other than Cu, obtained by the methods according to the present examples and the method according to one of the comparative examples.
Figure 5B:
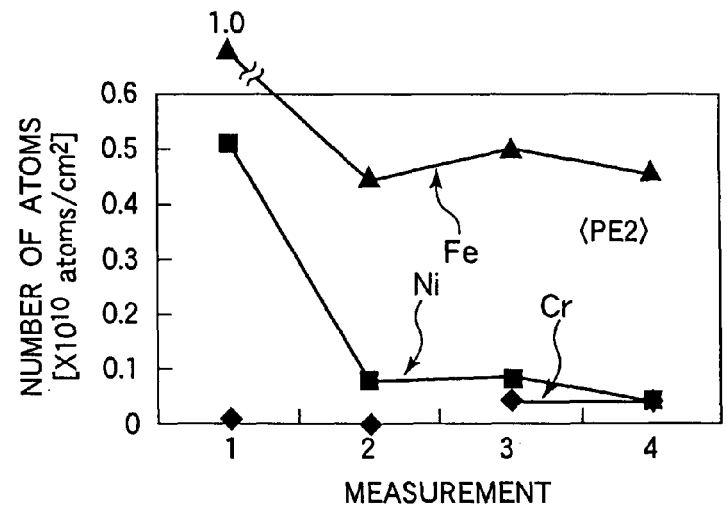
Figure 5C:
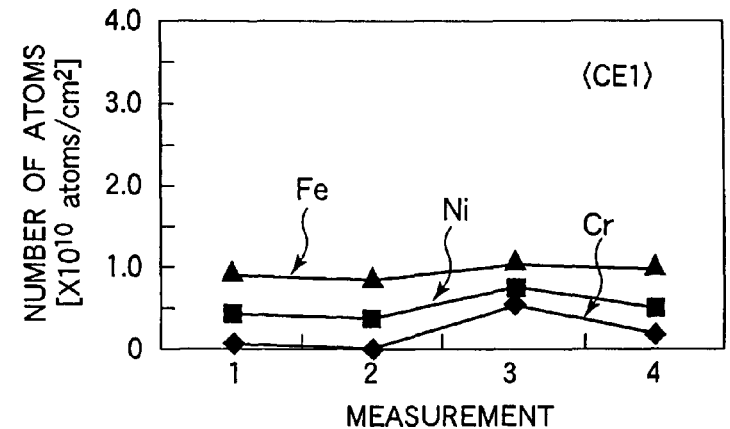

FIGS. 5A to 5C are graphs showing a change in the number of atoms of metals other than Cu, obtained by the methods according to the present examples and the method according to one of the comparative examples. The unit of the values is [$\times 10^{10}$ atoms/cm$^2$].

As shown in FIG. 5A corresponding to the present example PE1 and FIG. 5B corresponding to the present example PE2, in the case of the methods according to the present examples, as compared to the results obtained at Measurement 1 before the cleaning step, the number of atoms of Ni and Fe was drastically decreased at Measurements 2 to 4 after the respective cleaning steps. Accordingly, it has been confirmed that contamination of these metals is also decreased by the cleaning step. It should be noted that, since the Cr metal content was as low as the measurement lower limit from the beginning, and thus the results was partly out of measurement in FIG. 5A.

On the other hand, as shown in FIG. 5C corresponding to the method according to the comparative example CE1

(cleaning step: $O_2$ gas), the number of atoms of each of the Fe, Ni, and Cr was almost the same at Measurements 1 to 4. Accordingly, it has been confirmed that the method according to the comparative example CE1 can hardly remove contamination of these metals.

FIG. 6 is a diagram showing the content of cleaning processes performed in the experiment and the results of synthetic rating thereof. As shown in FIG. 6, the present example PE1 rendered a very high rating result of "⊚", and the present example PE2 rendered a high rating result of "○". On the other hand, the comparative examples CE1 and CE2 rendered a low rating result of "X".

<Cu Distribution in Depth Direction of Component Member>

The distribution state in the depth direction of a quartz component member (wafer boat 6) was measured and examined in cases where the methods according to the present example PE1 and comparative example CE1 were respectively used.

Figure 7:
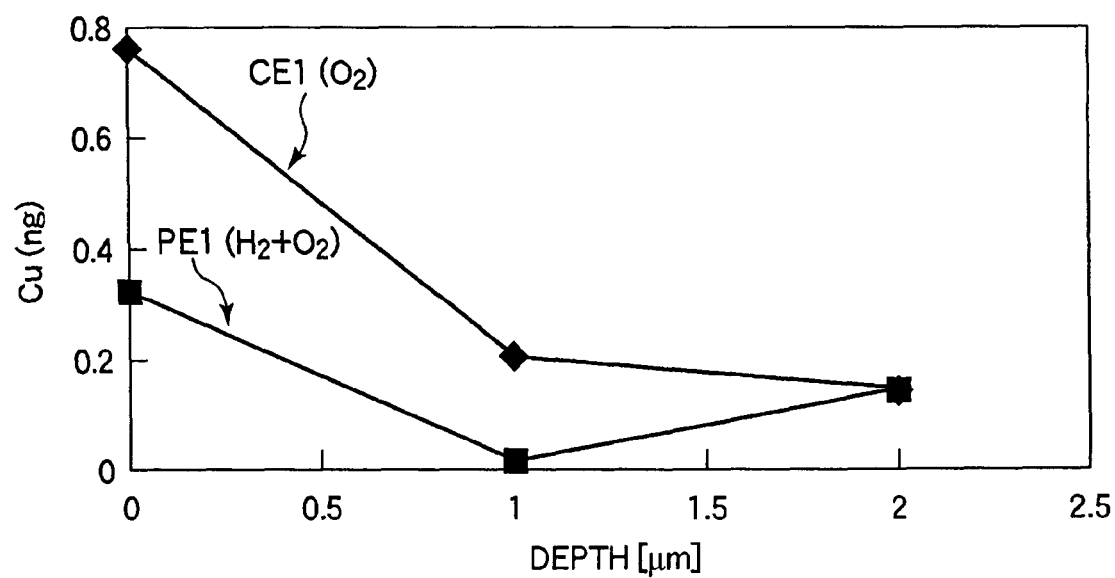
FIG. 7 is a graph showing distribution states of the copper content in the depth (thickness) direction of a quartz component member.

FIG. 7 is a graph showing distribution states of the copper content in the depth (thickness) direction of the quartz component member. As shown in FIG. 7, in the case of the comparative example CE1, the Cu metal content was as high as about 0.8 ng at the surface of the quartz component member, and then gradually decreased at depths of 1 μm and 2 μm. In this respect, when the distribution state of the copper content in the depth (thickness) direction of wafer boats was measured immediately after they ware delivered from a manufacturer, it was found that the distribution state was the same as that of the comparative example CE1.

On the other hand, in the case of the present example PE1, the Cu metal content was 0.3 ng, which was far lower than that of the comparative example CE1, at the surface of the quartz component member. The Cu metal content was minimum at a depth of 1 μm, and then gradually increased from the depth of 1 μm to a depth of 2 μm, at which it became almost the same as that of the comparative example CE1.

Consequently, it has been found that an cleaning process according to the embodiment of the present invention can drastically remove metal (Cu) in a component member down to a depth (thickness) of about 1 μm.

<Gas Supply Unit>

The apparatus shown in FIG. 1 is exemplified by a structure provided with facilities in advance for gas supply circuits corresponding to the oxidizing gas supply circuit 36 and second reducing gas supply circuit 34 of the gas supply mechanism 28. However, one or both of the facilities corresponding to the gas supply circuits 34 and 36 may be not present in processing apparatuses, depending on the type thereof. In this case, in order to perform the cleaning process described above, it is necessary to make up a shortfall by establishing a new supply circuit or circuits, which entail a large cost.

In light of this problem, parts of the second reducing gas supply circuit 34 and oxidizing gas supply circuit 36 are combined as a unit and structured to be easily movable. Where this unit is used, it is unnecessary to establish a new supply circuit or circuits.

Figure 8:
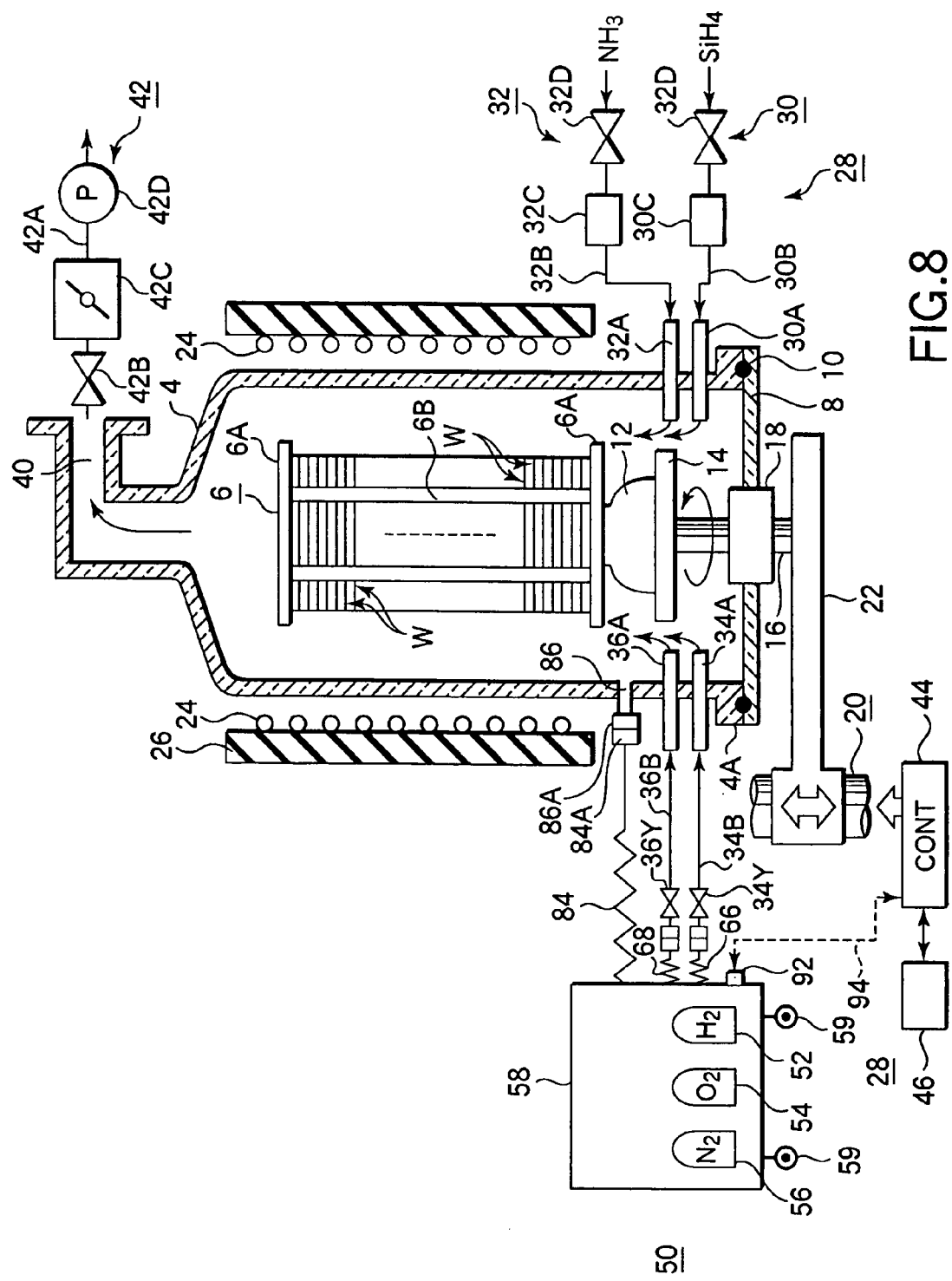
FIG. 8 is a view showing an example of a processing apparatus using a movable gas supply unit.
Figure 9:
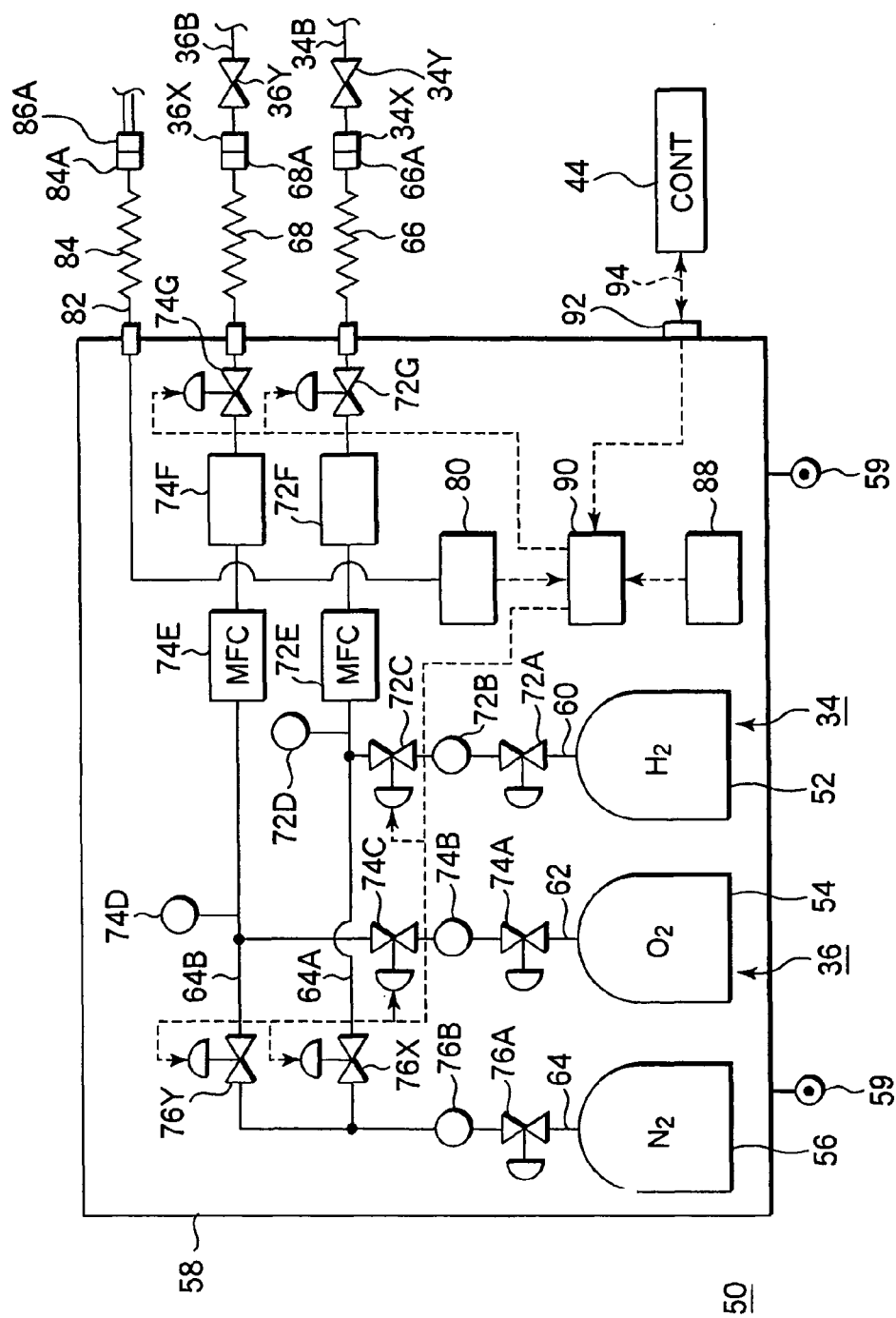
FIG. 9 is a structural view showing an example of the gas supply unit according to an embodiment of the present invention.

FIG. 8 is a view showing an example of a processing apparatus using a movable gas supply unit. FIG. 9 is a structural view showing an example of the gas supply unit according to an embodiment of the present invention.

As shown in FIGS. 8 and 9, the gas supply unit 50 includes a reducing gas cylinder 52 storing a reducing gas, an oxidizing gas cylinder 54 storing an oxidizing gas, and an inactive gas cylinder 56 storing an inactive gas. All of them are enclosed in a casing 58 formed of, e.g., a steel container in an essentially airtight state. The inactive gas cylinder 56 is used for purging the oxidizing gas and/or reducing gas, and is disposed, as needed. In this apparatus, $H_2$ gas is used as a reducing gas and $O_2$ gas is used as an oxidizing gas, as in the apparatus shown in FIG. 1. Further, $N_2$ gas is used as an inactive gas, but a rare gas, such as Ar or He, may be used for the same purpose.

Casters 59 are attached to the bottom of the casing 58 for the gas supply unit 50 to be easily movable. The reducing gas cylinder 52 and oxidizing gas cylinder 54 are respectively connected to a reducing gas line 60 and an oxidizing gas line 62 to form a second reducing gas supply circuit 34 and an oxidizing gas supply circuit 36.

The inactive gas cylinder 56 is connected to an inactive gas line 64. The other end of the inactive gas line 64 is divided into two branch lines 64A and 64B. The branch lines 64A and 64B are respectively connected to the reducing gas line 60 and oxidizing gas line 62.

The distal ends of the reducing gas line 60 and oxidizing gas line 62 extend out of the casing 58 through the side wall of the casing 58. These distal ends are provided with extensible and flexible corrugated tubes 66 and 68. Further, the corrugated tubes 66 and 68 are respectively connected to a reducing gas joint 66A and an oxidizing gas joint 68A at the distal ends. The reducing gas joint 66A can be connected to a joint 34X disposed at the end of a gas line 34B communicating with an $H_2$ gas nozzle 34A. The $H_2$ line 34B is provided with a switching valve 34Y. The oxidizing gas joint 68A can be connected to a joint 36X disposed at the end of a gas line 36B communicating with an $O_2$ gas nozzle 36A. The $O_2$ line 36B is provided with a switching valve 36Y.

The reducing gas line 60 is provided with a manual switching valve 72A, a regulator 72B, a first automatic switching valve 72C, a pressure gauge 72D, a flow rate controller 72E of e.g., a mass flow controller, a flow rate meter 72F for monitoring, and a second automatic switching valve 72G in this order from the reducing gas cylinder 52 toward the downstream side. The branch line 64A is connected to a position between the first automatic switching valve 72C and pressure gauge 72D.

The oxidizing gas line 62 is provided with a manual switching valve 74A, a regulator 74B, a first automatic switching valve 74C, a pressure gauge 74D, a flow rate controller 74E of e.g., a mass flow controller, a flow rate meter 74F for monitoring, and a second automatic switching valve 74G in this order from the oxidizing gas cylinder 62 toward the downstream side. The branch line 64B is connected to a position between the first automatic switching valve 74C and pressure gauge 74D.

The inactive gas line 64 is provided with a manual switching valve 76A and a regulator 76B in this order from the inactive gas cylinder 56 toward the downstream side. Further, the branch lines 64A and 64B of the inactive gas line 64 are respectively provided with automatic switching valves 76X and 76Y.

Inside the casing 58, a pressure detector 80 is disposed to detect the pressure inside the process container 4. For example, the pressure detector 80 is formed of a capacitance manometer. The pressure detector 80 is connected to a piping line 82 extending out of the casing 58 through the sidewall of the casing 58. The distal end of the piping line 82 is provided with an extensible and flexible corrugated tube 84. Further, the corrugated tube 84 is connected to a joint 84A at the distal end. The joint 84A is detachably connected to a joint 86A of a port 86 formed in a lower side of the sidewall of the process container 4, as shown in FIG. 8.

Inside the casing 58, a hydrogen detector 88 is disposed to detect the hydrogen concentration, so as to detect hydrogen leakage. Further, a control section 90 formed of, e.g., a computer is disposed to control the entire operation of the gas supply unit 50. The control section 90 receives inputs of detection values from the pressure gauges 72D and 74D, pressure detector 80, and hydrogen detector 88, so that it controls the operations of the switching valves and transmits flow rate instructions to the flow rate controllers 72E and 74E. The control section 90 is under the control of the apparatus control section 44 shown in FIG. 8, and is connected to the apparatus control section 44 through an external I/O terminal 92 for communicating various signals. However, the control section 90 may be controlled independently of the control of the apparatus control section 44.

Figure 10:
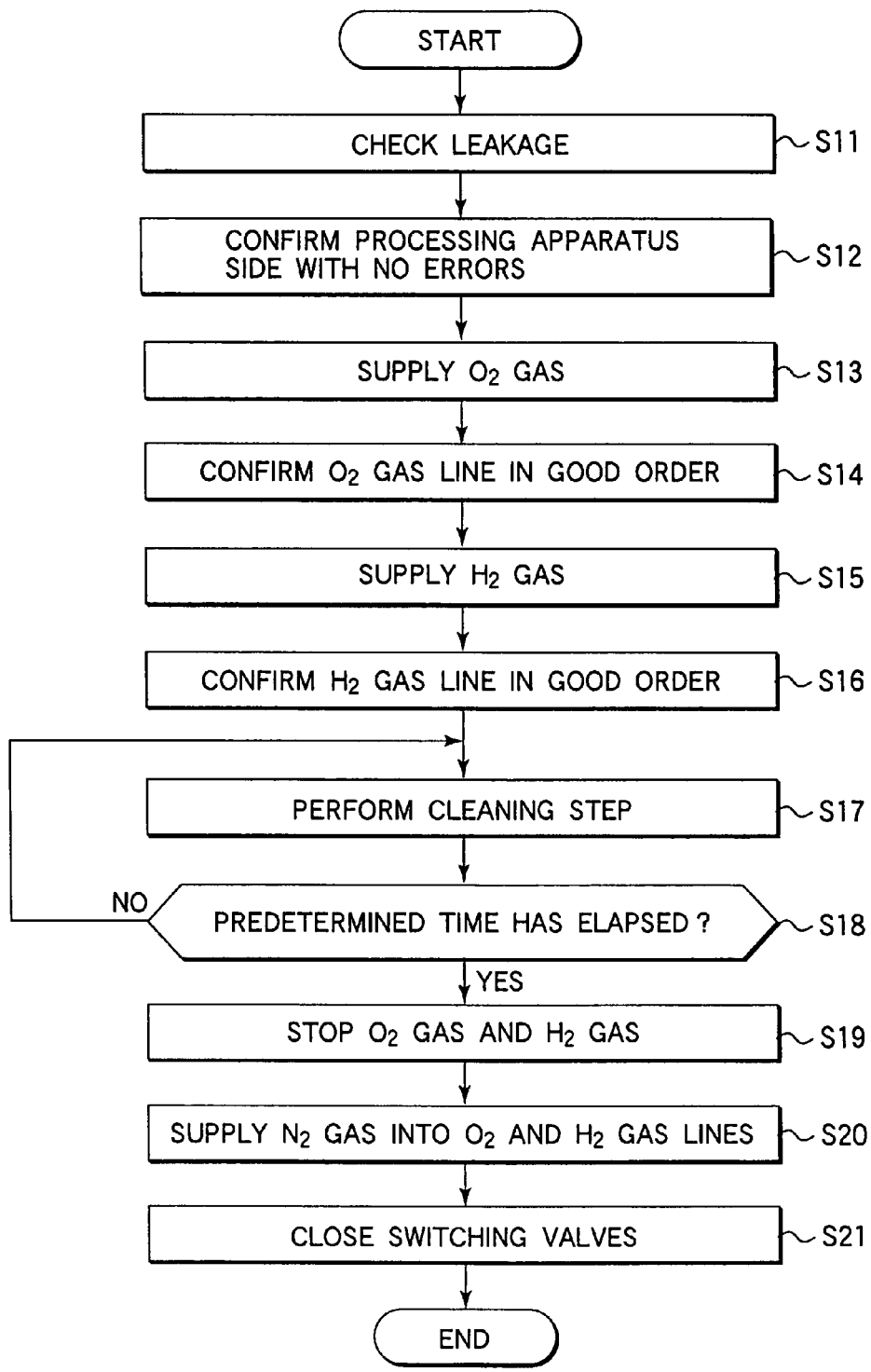
FIG. 10 is a flow chart for explaining an operation of the gas supply unit.

The reduction step and cleaning step described with reference to FIG. 1 are performed by use of the gas supply unit 50 thus structured. FIG. 10 is a flow chart for explaining an operation of the gas supply unit. The following explanation will be made, taking a cleaning step of the process container 4 as an example.

At first, the gas supply unit 50 is transferred to a position near the processing apparatus 2. Then, the reducing gas joint 66A is connected to the joint 34X. The oxidizing gas joint 68A is connected to the joint 36X. The joint 84A of the corrugated tube 84 is connected to the joint 86A. Then, the manual switching valves 72A, 74A, and 76A are respectively opened. Further, a signal line 94 extending from the apparatus control section 44 is connected to the external I/O terminal 92. FIG. 8 shows a state at this time. After predetermined leakage is checked (Step S1), the switching valves 34Y and 36Y are respectively opened, so that the unit 50 is set in a ready state.

Then, while the interior of the process container 4 of the processing apparatus 2 is vacuum-exhausted at full load, the following steps are performed. Specifically, the respective lines inside the gas supply unit 50 are filled with $N_2$ gas at atmospheric pressure in advance. Since the interior of the process container 4 is vacuum-exhausted at full load, the atmosphere inside the process container 4 cannot flow back to the gas lines 34B and 36B, whereby the gas supply unit 50 is prevented from being contaminated.

A sequence is started after the pressure detector 80 formed of a capacitance manometer detects pressure reduction and an operator pushes a safety button (not shown). Then, if external input/output can be performed, data concerning pressure, temperature, and so forth is received from the processing apparatus side, to confirm that the processing apparatus side (process container 4) has no errors (Step S12).

Where the processing apparatus side has no errors, the $O_2$ switching valves 74C and 74G are opened to supply $O_2$ gas into the process container 4 at a controlled flow rate (Step S13). At this time, it is confirmed that the $O_2$ flow rate controller 74E, pressure gauge 74D, and the pressure inside the container are in good order (Step S14). This confirming operation is continuously performed thereafter.

Then, the $H_2$ switching valves 72C and 72G are opened to supply $H_2$ gas into the process container 4 at a controlled flow rate (Step S15). At this time, it is confirmed that the $H_2$ flow rate controller 72E, pressure gauge 72D, and the pressure inside the container are in good order (Step S16). This confirming operation is continuously performed thereafter.

Consequently, a cleaning step is performed inside the process container 4 at a predetermined temperature and a predetermined pressure, as described with reference to the embodiment (Step S17). The cleaning step is performed for a predetermined time (NO in Step S18). When the predetermined time has elapsed for the cleaning step (YES in Step S18), the switching valves 72C and 74C are closed to stop the supply of $H_2$ gas and $O_2$ gas into the process container 4 (Step S19).

Then, $N_2$ switching valves 76X and 76Y are opened to supply $N_2$ gas into the reducing gas ($H_2$) line 60 and oxidizing gas ($O_2$) line 62 to purge $H_2$ gas and $O_2$ gas remaining inside the gas lines 60 and 62 (Step S20). Then, all the switching valves are closed while the reducing gas line 60 and oxidizing gas line 62 are filled with $N_2$ gas and set at atmospheric pressure (Step S21). Thus, the cleaning step is completed.

While the cleaning step is being performed, detection values of the pressure gauges 72D and 74D for measuring gas supply pressure, detection values of the hydrogen detector 88, and detection values of the pressure detector 80 for detecting the pressure inside the process container 4 are always input into the control section 90. When, an abnormality was found, the control section 90 stops the process.

As described above, the gas supply unit is movable and contains the oxidizing gas ($O_2$) cylinder 54, reducing gas ($H_2$) cylinder 52, flow rate controllers 74E and 72E for controlling the flow rates of these gases, and so forth. Accordingly, even in a processing apparatus including no supply circuits of an oxidizing gas, such as $O_2$ and a reducing gas, such as $H_2$, the cleaning process described above can be performed without necessitating an expense for facility renovation.

The embodiment described above is exemplified by a case where the gas supply unit 50 is used for cleaning the inner surface of the quartz process container 4 and quartz components inside the process container 4. However, the gas supply unit 50 may be used for cleaning a quartz member to remove metal contaminants present on and in the surface thereof. For example, the gas supply unit may be used for cleaning a quartz LCD substrate or quartz optical lens.

In the embodiment described above, the oxidizing gas is $O_2$ gas while the reducing gas is $H_2$ gas, but this is not limiting. The oxidizing gas may be one or more gases selected from the group consisting of $O_2$, $O_3$, and $N_xO_y$ (x and y are integers). The $N_xO_y$ includes NO, $N_2O$, and $NO_2$. The reducing gas may be one or more gases selected from the group consisting of $H_2$, $NH_3$, $CH_4$, HCl, D (deuterium), $D_2$, $ND_3$, $CD_4$, and DCl.

In the embodiment described above, a predetermined process performed in the processing apparatus 2 is exemplified by a film formation process for forming an $SiO_2$ film. The present invention may be applied to a film formation process for another thin film, such as a silicon nitride film or silicon oxynitride film. Where a silicon nitride film is formed, the process gas supply circuit is arranged to supply a silicon source gas and a nitriding gas, such as $NH_3$ gas. Where a silicon oxynitride film is formed, the process gas supply circuit is arranged to supply a silicon source gas and an oxynitriding gas, such as dinitrogen oxide ($N_2O$) or nitrogen oxide (NO).

When such a film formation process is repeated a plurality of times, reaction products generated during the film formation process are deposited (adhered) not only on the surface of semiconductor wafers, but also on, e.g., the inner surface of the process container and other members, the latter being as by-product films. Accordingly, it is preferable to perform a process for removing such by-product films containing the film material as the main component, after the film formation process is repeated a predetermined number of times and before the cleaning process described above is performed. In order to remove by-product films derived from a silicon oxidation film, silicon nitride film, or silicon oxynitride film, a gas containing a halogen element and hydrogen element may be used. For example, a gas containing one or more gases selected from the group consisting of HF, $Cl_3$, $NF_3$, and $F_2$ may be used.

The present invention is applicable to a film formation process for any one of other various films, such as a metal film, an insulating film, and a conductive film. Further, the present invention is not limited to a film formation process, and it may be applied to any one of various semiconductor processing apparatuses for, e.g., oxidation/diffusion, annealing, and reformation processes.

In the embodiment described above, the processing apparatus is a heat processing apparatus of the batch type having a single-tube structure. However, for example, the present invention may be applied to a vertical heat processing apparatus of the batch type having a process container of the double-tube type, which is formed of inner and outer tubes. Alternatively, the present invention may be applied to a heat processing apparatus of the single-substrate type. Particularly, the present invention is effectively applied to a processing apparatus of the single-substrate type including a process container, a susceptor, and/or a showerhead, which are made of quartz. As regards the target substrate, the present invention may be applied to a glass substrate, LCD substrate, or ceramic substrate, in place of a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a vertical semiconductor processing apparatus configured to process a plurality of target substrates placed at intervals in a vertical direction inside a process container which has an inner surface containing, as a main component, a material selected from the group consisting of quartz and silicon carbide, the method comprising:

supplying $O_2$ gas and $H_2$ gas into the process container accommodating no product target substrate therein;

causing the $O_2$ gas and the $H_2$ gas to react with each other within a first atmosphere that activates the $O_2$ gas and the $H_2$ gas inside the process container only by heating the process container, thereby generating radicals; and removing a contaminant from the inner surface of the process container by use of the radicals, the contaminant being a contaminant containing a metal.

2. The method according to claim 1, wherein the first atmosphere is set to have a temperature of 400 to 1,100° C.

3. The method according to claim 1, wherein the first atmosphere is set to have a pressure of 0.133 to 933 Pa.

4. The method according to claim 1, wherein, before said supplying $O_2$ gas and $H_2$ gas, the method further comprises supplying a preparatory reducing gas into the process container accommodating no product target substrate therein, thereby performing preparatory reduction of the contaminant within a preparatory atmosphere that activates the preparatory reducing gas.

5. The method according to claim 4, wherein the contaminant is a contaminant containing a metal oxide.

6. The method according to claim 5, wherein the metal oxide comprises oxide of one or more elements selected from the group consisting of Cu, Ni, and Fe.

7. The method according to claim 4, wherein the preparatory atmosphere is set to have a temperature of 700 to 1,000° C.

8. The method according to claim 4, wherein the preparatory atmosphere is set to have a pressure of 0.133 to 15,999 Pa.

9. The method according to claim 4, wherein the preparatory reducing gas is a gas the same as or different from the $H_2$ gas.

10. The method according to claim 1, wherein, before said supplying $O_2$ gas and $H_2$ gas, the method further comprises forming a film by CVD on product target substrates inside the process container.

11. The method according to claim 10, wherein, between said forming a film and said supplying $O_2$ gas and $H_2$ gas, the method further comprises removing a by-product film deposited on the inner surface of the process container, by use of a film removing gas.

12. The method according to claim 11, wherein said forming a film by CVD comprises supplying a first film formation gas comprising a silicon-containing gas and a second film formation gas comprising a gas selected from the group consisting of a nitriding gas, an oxidation gas, and an oxynitriding gas into the process container, thereby forming a film of a substance selected from the group consisting of silicon nitride, silicon oxide, and silicon oxynitride.

13. The method according to claim 12, wherein the film removing gas comprises a gas containing a halogen element and hydrogen element.

14. A computer readable medium containing program instructions for execution on a processor in a vertical semiconductor processing apparatus configured to process a plurality of target substrates placed at intervals in a vertical direction inside a process container which has an inner surface containing, as a main component, a material selected from the group consisting of quartz and silicon carbide, wherein the program instructions, when executed by the processor, control the apparatus to execute the steps of:

supplying $O_2$ gas and $H_2$ gas into the process container accommodating no product target substrate therein;

causing the $O_2$ gas and the $H_2$ gas to react with each other within an atmosphere that activates the $O_2$ gas and the $H_2$ gas inside the process container only by heating the process container, thereby generating radicals; and removing a contaminant from the inner surface of the process container by use of the radicals, the contaminant being a contaminant containing a metal.

* * * * *